(12) United States Patent
Lee et al.

(10) Patent No.: US 10,132,865 B2
(45) Date of Patent: Nov. 20, 2018

(54) SEMICONDUCTOR CHIP, TEST SYSTEM, AND METHOD OF TESTING THE SEMICONDUCTOR CHIP

(71) Applicant: Samsung Electronics Co., Ltd., Suwon-si, Gyeonggi-do (KR)

(72) Inventors: Seon-kyoo Lee, Hwaseong-si (KR); Jeong-don Ihm, Seongnam-si (KR); Byung-hoon Jeong, Hwaseong-si (KR); Dae-woon Kang, Suwon-si (KR); Tae-sung Lee, Hwaseong-si (KR); Sang-lok Kim, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/170,940

(22) Filed: Jun. 1, 2016

(65) Prior Publication Data
US 2017/0052225 A1    Feb. 23, 2017

(30) Foreign Application Priority Data

Aug. 17, 2015   (KR) ........................ 10-2015-0115418

(51) Int. Cl.
*G01R 31/28* (2006.01)
*G01R 31/3183* (2006.01)
*G01R 31/317* (2006.01)

(52) U.S. Cl.
CPC ............... *G01R 31/318392* (2013.01); *G01R 31/31708* (2013.01)

(58) Field of Classification Search
CPC .................. G01R 31/318392; G01R 31/31708
See application file for complete search history.

(56) References Cited

U.S. PATENT DOCUMENTS

| | | | |
|---|---|---|---|
| 5,220,187 A | 6/1993 | Miyaoka et al. | |
| 5,396,247 A * | 3/1995 | Watanabe | G04F 10/005 341/157 |
| 5,818,797 A * | 10/1998 | Watanabe | G04F 10/00 368/113 |
| 5,994,726 A | 11/1999 | Ikeda et al. | |
| 6,084,255 A | 7/2000 | Ueda et al. | |
| 6,823,293 B2 | 11/2004 | Chen et al. | |
| 7,355,544 B2 * | 4/2008 | Watanabe | H03M 1/06 341/155 |
| 7,478,302 B2 | 1/2009 | Veendrick | |

(Continued)

FOREIGN PATENT DOCUMENTS

JP     2997479 B2   10/1999
JP     2001068549 A  3/2001

(Continued)

*Primary Examiner* — Thien Nguyen
(74) *Attorney, Agent, or Firm* — Renaissance IP Law Group LLP

(57) ABSTRACT

A semiconductor chip, a test system, and a method of testing the semiconductor chip. The semiconductor chip includes a pulse generator configured to generate a test pulse in response to a test request; a logic chain comprising a plurality of logic devices serially connected to each other and transferring the test pulse sequentially; and a detector configured to detect a logic level of an output signal of each of the logic devices and output a detection result indicating a degree of an inter-symbol interference (ISI).

22 Claims, 9 Drawing Sheets

(56) References Cited

U.S. PATENT DOCUMENTS

| | | | |
|---|---|---|---|
| 7,652,497 | B2 | 1/2010 | Kim et al. |
| 7,679,106 | B2 | 3/2010 | Hamada |
| 8,213,490 | B2 | 7/2012 | Jang |
| 8,258,552 | B2 | 9/2012 | Becker et al. |
| 8,264,049 | B2 | 9/2012 | Becker |
| 8,455,354 | B2 | 6/2013 | Chen et al. |
| 8,610,176 | B2 | 12/2013 | Patel et al. |
| 8,836,040 | B2 | 9/2014 | Kamal et al. |
| 8,921,896 | B2 | 12/2014 | Becker et al. |
| 9,041,422 | B2 | 5/2015 | Baumann et al. |
| 2005/0141334 | A1* | 6/2005 | Jeong ............... G11C 7/22 365/189.05 |
| 2005/0253631 | A1* | 11/2005 | Kim ................. G11C 7/1051 327/144 |
| 2005/0278596 | A1 | 12/2005 | Miyajima et al. |
| 2008/0054260 | A1* | 3/2008 | Ishitobi ........... G01R 31/2855 257/48 |
| 2011/0216057 | A1* | 9/2011 | Fan ................. G06F 3/038 345/213 |
| 2012/0249170 | A1* | 10/2012 | Baumann ......... G01R 31/2843 324/750.3 |
| 2013/0032885 | A1 | 2/2013 | Swamynathan et al. |
| 2015/0043926 | A1 | 2/2015 | Levy et al. |
| 2015/0249461 | A1* | 9/2015 | Terazawa ............ H03M 1/12 341/155 |

FOREIGN PATENT DOCUMENTS

| | | |
|---|---|---|
| JP | 2007073885 A | 3/2007 |
| JP | 2008249481 | 10/2008 |
| JP | 2011215066 | 10/2011 |
| KR | 100311489 | 11/2001 |

\* cited by examiner

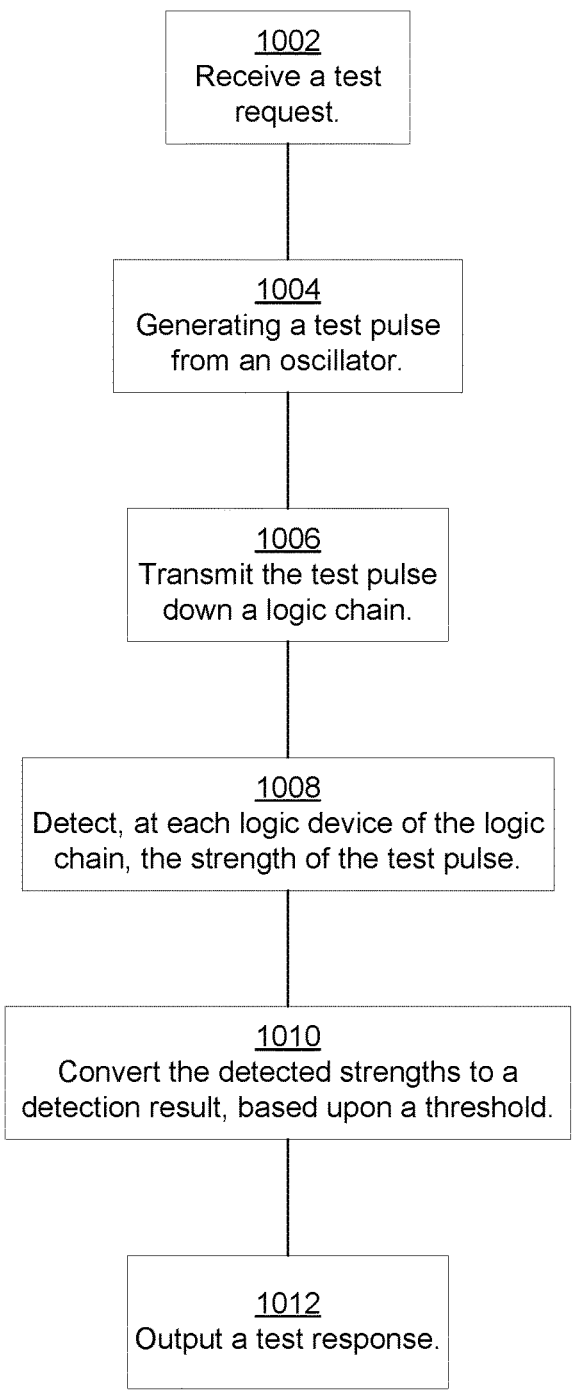

SEMICONDUCTOR CHIP, TEST SYSTEM, AND METHOD OF TESTING THE SEMICONDUCTOR CHIP

CROSS-REFERENCE TO RELATED APPLICATION

This application claims the benefit of Korean Patent Application No. 10-2015-0115418, filed on Aug. 17, 2015, in the Korean Intellectual Property Office, the disclosure of which is incorporated herein in its entirety by reference.

BACKGROUND

The disclosed subject matter relates to a semiconductor chip capable of reducing the production cost, a test system, and a method of testing the semiconductor chip.

In manufacturing a semiconductor chip, a test of various levels regarding if the semiconductor chip satisfies a specific condition is performed for each processing stage, and the semiconductor chip that fails the test is processed as a defective chip. For example, the test such as a variation of process, voltage, and temperature (PVT) of the semiconductor chip and a degree of an inter-symbol interference (ISI) thereof, etc. may be performed. In this regard, if it is detected at an initial stage whether the semiconductor chip is defective, the production cost of the semiconductor chip may be reduced without having to add unnecessary expenses.

SUMMARY

The disclosed subject matter provides a semiconductor chip capable of reducing the production cost, a test system, and a method of testing the semiconductor chip.

According to an aspect of the disclosed subject matter, there is provided a semiconductor chip including a pulse generator configured to generate a test pulse in response to a test request; a logic chain including a plurality of logic devices serially connected to each other and transferring the test pulse sequentially; and a detector configured to detect a logic level of an output signal of each of the logic devices and output a detection result indicating a degree of an inter-symbol interference (ISI).

According to another aspect of the disclosed subject matter, there is provided a test system including a wafer including a plurality of semiconductor chips; and a tester configured to transfer a test request to each of the plurality of semiconductor chips, receive a test response corresponding to the test request from the plurality of semiconductor chips, and output test results, wherein each of the plurality of semiconductor chips generates a test pulse in response to the test request and outputs a test response indicating a time point when the test pulse is extinguished.

According to yet another aspect of the disclosed subject matter a method may include generating, by a semiconductor chip, a test pulse. The method may include transmitting the test pulse down a logic chain of the semiconductor chip, wherein the logic chain comprises a plurality of logic devices arranged in series. The method may also include detecting, at each logic device of the logic chain, strength of the test pulse. The method may further include based upon a threshold value and the detected strength of the test pulse, generating a detection result that indicates an inter-symbol interference (ISI) characteristic of the semiconductor chip.

BRIEF DESCRIPTION OF THE DRAWINGS

Exemplary embodiments of the disclosed subject matter will be more clearly understood from the following detailed description taken in conjunction with the accompanying drawings in which:

FIG. 10 illustrates a technique according to the disclosed subject matter.

DETAILED DESCRIPTION OF THE EMBODIMENTS

Figure 1:
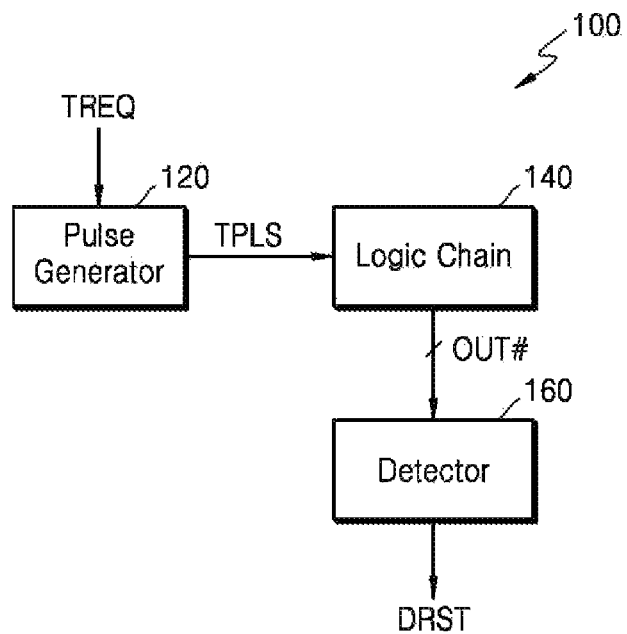
FIG. 1 illustrates a semiconductor chip according to an exemplary embodiment.

Exemplary embodiments of the disclosed subject matter are provided to fully convey the disclosed subject matter to those skilled in the art. The disclosed subject matter may be embodied in many different forms and should not be construed as limited to the exemplary embodiments set forth herein. It is to be appreciated that any and all alterations, equivalents, and/or substitutes that do not depart from the spirit and technical scope of the disclosed subject matter are encompassed in the disclosed subject matter.

Like elements will be rendered the same reference numeral in regard to description of the attached drawings. In the attached drawings, dimensions of structures may be exaggerated or contracted for purposes of illustration and to clarify the understanding of the disclosed subject matter.

The terms used in the present specification are merely used to describe particular embodiments, and are not intended to limit the disclosed subject matter. An expression used in the singular encompasses the expression of the plural, unless it has a clearly different meaning in the context. In the present specification, it is to be understood that the terms such as "including" or "having," etc., are intended to indicate the existence of the features disclosed in the specification, and are not intended to preclude the possibility that one or more other features may exist or may be added. As used herein, the term "and/or" includes any and all combinations of one or more of the associated listed items. In the present specification, terms such as 'first', 'second', etc. are used to describe various features and used only for distinguishing one feature from another, and the features are not limited by the terms. Thus, when a first feature is described as being connected or coupled to a second feature, a third feature between the first and second features is not precluded.

Unless defined differently, all terms used in the description including technical and scientific terms have the same meaning as generally understood by those skilled in the art.

Terms as defined in a commonly used dictionary should be construed as having the same meaning as in an associated technical context, and unless defined apparently in the description, the terms are not ideally or excessively construed as having formal meaning.

Hereinafter, an exemplary embodiment of the present disclosed subject matter is described in detail with reference to the accompanying drawings.

FIG. 1 illustrates a semiconductor chip 100 according to an exemplary embodiment. Referring to FIG. 1, the semiconductor chip 100 may include a pulse generator 120, a logic chain 140, and a detector 160. It is understood that the above are merely a few illustrative examples to which the disclosed subject matter is not limited.

The pulse generator 120 may generate a test pulse TPLS in response to a test request TREQ. The test request TREQ may be generated, applied, or output from a tester (not shown) so as to test a degree or amount of inter-symbol interference (ISI) associated with the semiconductor chip 100 on a wafer. The pulse generator 120 may generate the test pulse TPLS as a single pulse.

Figure 2:
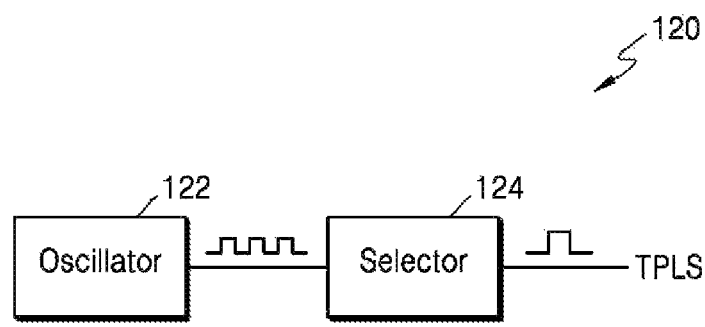
FIG. 2 illustrates an example of a pulse generator of FIG. 1.

For example, as shown in FIG. 2, the pulse generator 120 may include an oscillator 122 that is activated in response to the test request TREQ and a selector 124 that selects one of the multiple pulses generated by the oscillator 122. The selector 124 may generate the test pulse TPLS from this the single pulse.

The pulse generator 120 may further include an element or component that performs trimming such that the test pulse TPLS has a uniform pulse width. For example, in such an embodiment, the selector 124 of the pulse generator 120 may include a plurality of delay elements (e.g., buffers, etc.) that are serially connected to each other. A resistor or a capacitor that is connected to each of the delay elements may prevent a distortion of the test pulse TPLS.

The selector 124 of the pulse generator 120 may select a plurality of pulses from the multiple pulses generated by the oscillator 122 and output those plurality of pulses as the test pulse TPLS. However, for convenience of description, unless described separately, it is assumed that the test pulse TPLS is generated as the single pulse. It is understood that such is merely one illustrative example to which the disclosed subject matter is not limited.

Returning to FIG. 1, the logic chain 140 may include a plurality of logic devices or circuit that are essentially serially connected to each other and sequentially transfer the test pulse TPLS from one logic device to the next. In various embodiments, this logic chain 140 may include a plurality of flip-flops, logic gates, and/or a scan chain.

Figure 3A:
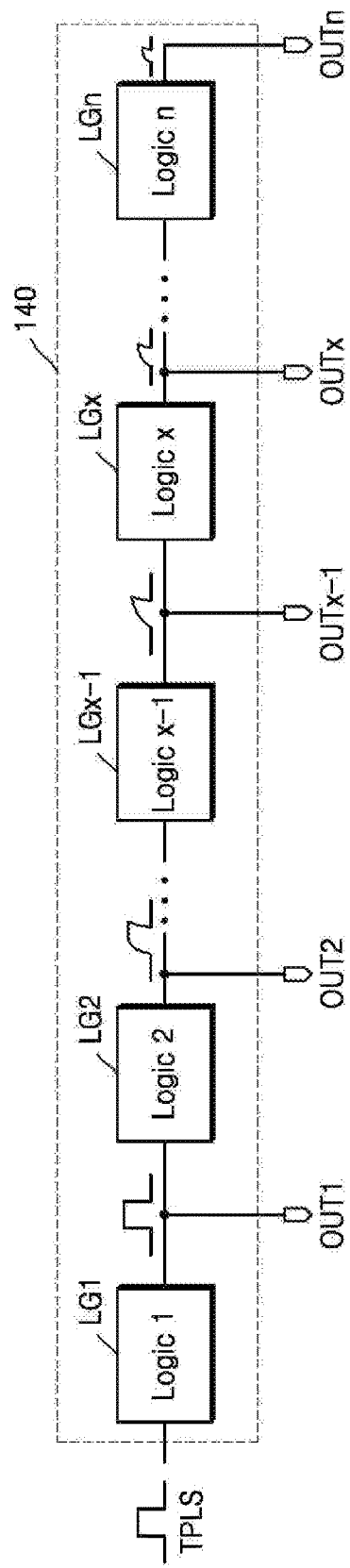
FIGS. 3A and 3B illustrate examples of a logic chain of FIG. 1.

For example, as shown in FIG. 3A, n (n is an integer equal to or greater than 2) logic devices LG1, LG2, LGx−1, LGx, an so on to LGn of the logic chain 140 are serially connected to each other and each receive either the test pulse TPLS or the output of the previous logic device as an input. For example, the first logic LG1 may transfer the test pulse TPLS as a first output OUT1, and the second logic device LG2 may transfer the first output OUT1 of the first logic device LG1 as a second output OUT2. Likewise, an xth logic device LGx may transfer an output OUTx−1 of an x−1th logic device LGx−1 as an x output (OUTx). In various embodiments, x may be a positive integer equal to or smaller than n.

Figure 3B:
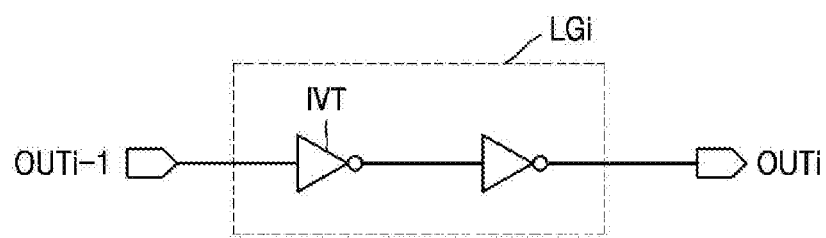

As shown in FIG. 3B, an arbitrary logic device LGi may include, for example, an even inverter IVT to transfer an output OUTi−1 of a previous end and output OUTi. In such an embodiment, i may be a positive integer equal to or smaller than n. However, the disclosed subject matter is not limited thereto. Each of the logic devices LG1-LGn may be implemented as various logic gates such as a NAND gate.

The logic chain 140 may sequentially transfer the test pulse TPLS by each of the logic devices LG1-LGn. This transmission via various logic devices may weaken the intensity of the test pulse TPLS, and thus the test pulse TPLS may gradually fade out or attenuate. In this regard, an amount of time before the test pulse TPL is extinguished may differ according to the degree of the ISI of the semiconductor chip 100. For example, if the degree of the ISI of the semiconductor chip 100 is high, a speed at which the test pulse TPL fades out may be faster, and, if the degree of the ISI of the semiconductor chip 100 is low, the speed at which the test pulse TPL fades out may be slower.

Figure 4A:
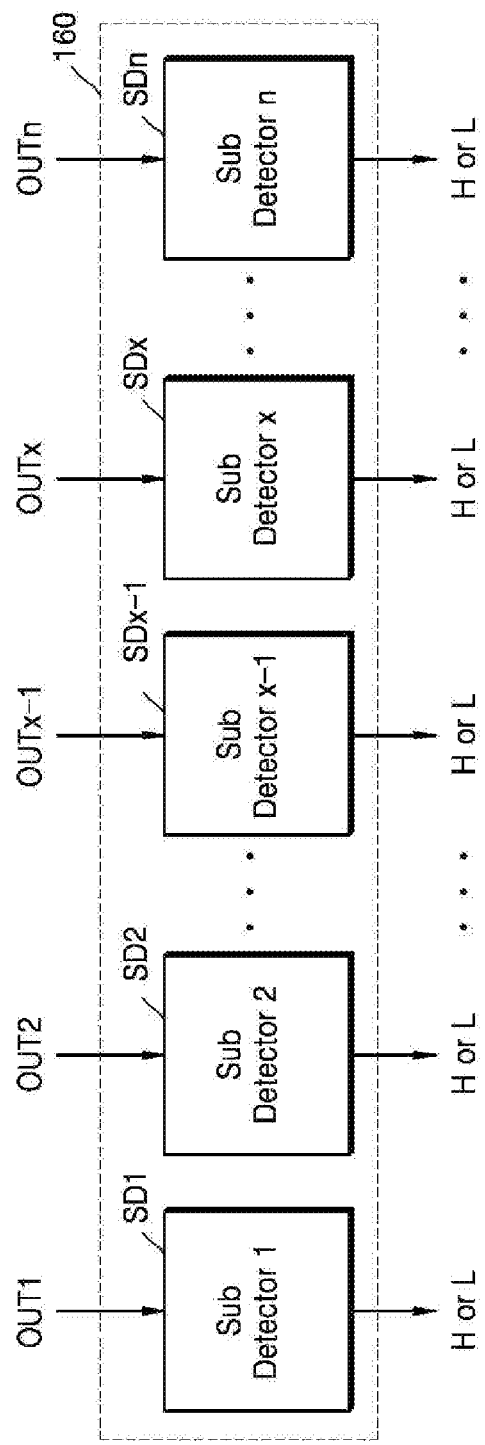
FIGS. 4A and 4B illustrate examples of a detector of FIG. 1.

Returning to FIG. 1, the detector 160 may detect a level of the output OUT of the logic chain 140 and output a detection result DRST. As shown in FIG. 4A, the detector 160 may include a plurality of sub-detectors SD1, SD2, SDx−1, SDx, and so on to SDn. The detector 160 may include the same number of sub-detectors SD1-SDn as that of the logic devices LG1-LGn of the logic chain 140. The detector 160 may maintain or change an initial value of each of the sub-detectors SD1-SDn in response to the outputs OUT1-OUTn of the logic devices LG1-LGn, thereby outputting the detection result DRST indicating which portion of the logic chain 140 transfers the test pulse TPLS at higher than a threshold level.

The detector 160 may detect of levels of the outputs OUT1-OUTn of the respective logic devices LG1-LGn and output one of a logic high H or a logic low L. For example, the first sub-detector SD1 may detect the level of the output OUT1 of the first logic device LG1 and output one of the logic high H or the logic low L, and the second sub-detector SD2 may detect the level of the output OUT2 of the second logic device LG2 and output one of the logic high H or the logic low L. Likewise, a x−1th sub-detector SDx−1 may detect a level of an output OUTx−1 of the x−1th logic device LGx−1 and output one of the logic high H or the logic low L, a xth sub-detector SDx may detect a level of an output OUTx of the xth logic device LGx and output one of the logic high H or the logic low L, and an nth sub-detector SDn may detect a level of an output OUTn of the nth logic device LGn and output one of the logic high H or the logic low L. Thus, the detector 160 may output the detection result DRST with a width of n bits.

Figure 4B:
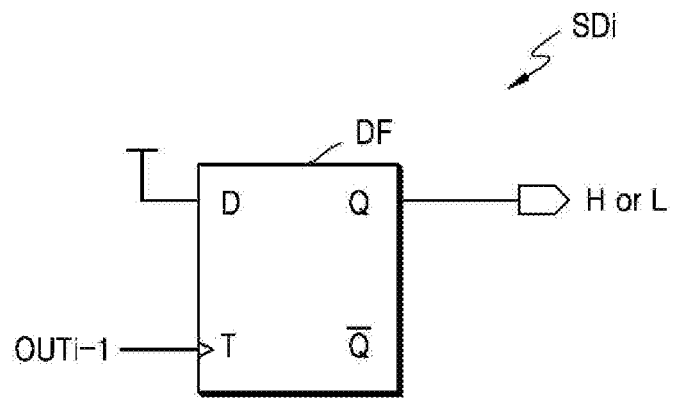

As shown in FIG. 4B, the example sub-detector SDi may include a D flip-flop DF in which the output OUTi−1 of a logic device (for example, the logic device LGi of FIG. 3B) corresponding to the sub-detector SDi is input into a clock terminal T. The D flip-flop DF may have an initial input terminal D that is set as 1 (the logic high H) and an initial output terminal Q that is set as 0 (the logic low L). Thereafter, if the output OUTi−1 of the corresponding logic device is input into the clock terminal T, the logic high H may be output from the output terminal Q, whereas, if the output OUTi−1 of the corresponding logic device is extinguished, the output terminal Q of the D flip-flop DF may maintain the logic low L.

Each of the sub-detectors SD1-SDn of FIG. 4A may output one of the logic high H or the logic low L according to the operation described above. As shown in FIG. 3A, the test pulse TPLS may significantly deteriorate after passing through each of the logic devices LG1 through LGn. Further, after passing through the xth logic device LGx (whatever number of the plurality x happens to be), the test pulse TPLS may be unable to clock the D flip-flop DF such that the first through x−1th sub-detectors SD1-SDx−1 may output the logic high H, and the xth sub-detector SDx through nth sub-detector SDn may output the logic low L. Thus, the detector 160 may output the detection result DRST of n bits having values of first through x−1th bits as 1 and values of xth through nth bit as 0.

In various embodiments, the detector 160 may include a sub-detector other than the D flip-flop DF. For example, the detector 160 may include the sub-detector that is implemented as a PMOS transistor connected between a power voltage and a first node having an initial value set as the logic high H and an NMOS transistor that is connected between the first node and a ground voltage and has a corresponding output applied to a gate among the outputs OUT1-OUTn of the logics LG1~LGn. In this case, if the output of the corresponding logic is at a level capable of gating the NMOS transistor, the NMOS transistor is turned off, and subsequently, the first node is transited to the logic low L.

Figure 5:
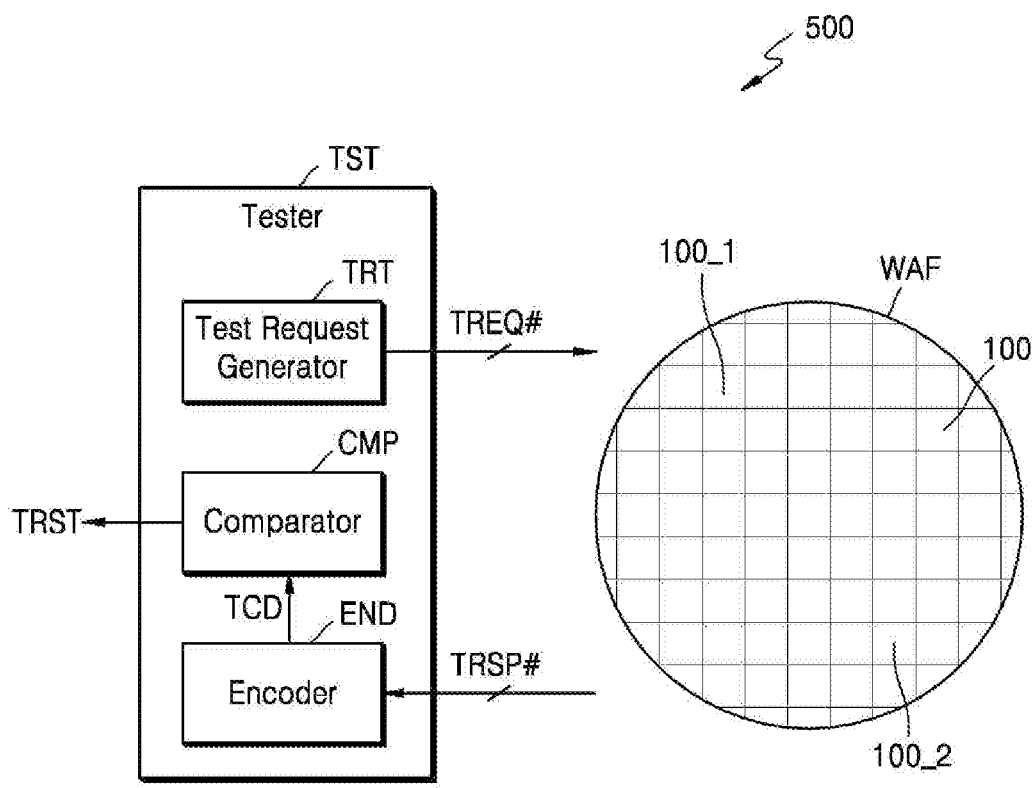
FIG. 5 illustrates a test system according to an exemplary embodiment.

FIG. 5 illustrates a test system 500 according to an exemplary embodiment. In the illustrated embodiment, the test system 500 may include a tester TST and a wafer WAF. The tester TST may include a test request generator TRG, an encoder END, and a comparator CMP. The test request generator TRG may generate the test request TREQ (or its inverse, inverse test request TREQ#) that tests the degree of ISI associated with of the plurality of semiconductor chips 100 on the wafer WAF. A plurality of test requests TREQ may be respectively applied to the plurality of semiconductor chips 100 at the same time or at different times.

The encoder END may receive a test response TRSP (or its inverse, inverse test response TRSP#) from each of the semiconductor chips 100 and encode the test response TRSP in a test code TCD. For example, the test code TCD may include the detection result DRST (of FIG. 1) and an identifier associated with a semiconductor chip 100 that generated the detection result DRST. For example, the encoder END may receive the detection result DRST as the test response TRSP from each of the semiconductor chips 100. The encoder END may receive the test responses TRSP from the semiconductor chips 100 at the same time or at different time.

The comparator CPM may compare the test code TCD and a reference value and generate a test result TRST. The reference value may indicate a maximum degree of the ISI that is allowable to each of the semiconductor chips 100. For example, the reference value may indicate that the test pulse TPLS needs to be transferred up to a x−1th logic LGx−1 of FIG. 3A, wherein the numerical value of x is determined by the test criteria. In the above example, when the test code TCD indicates that the detection result DRST of n bits of each of the semiconductor chips 100 indicates 1 as a value of the x−1th bit, the comparator CMP may output the test result TRST as 'pass'. However, the comparator CMP may output the test result TRST as 'fail' with respect to the semiconductor chip 100 in which the detection result DRST of n bits does not indicate 1 as the value of the x−1th bit.

The wafer WAF may include the plurality of semiconductor chips 100. The plurality of semiconductor chips 100 included in the wafer WAF may be semiconductor chips of a wafer level. The plurality of semiconductor chips 100 on one wafer WAF may perform the same function. For example, each of the plurality of semiconductor chips 100 on one wafer WAF may be a memory chip.

Figure 6:
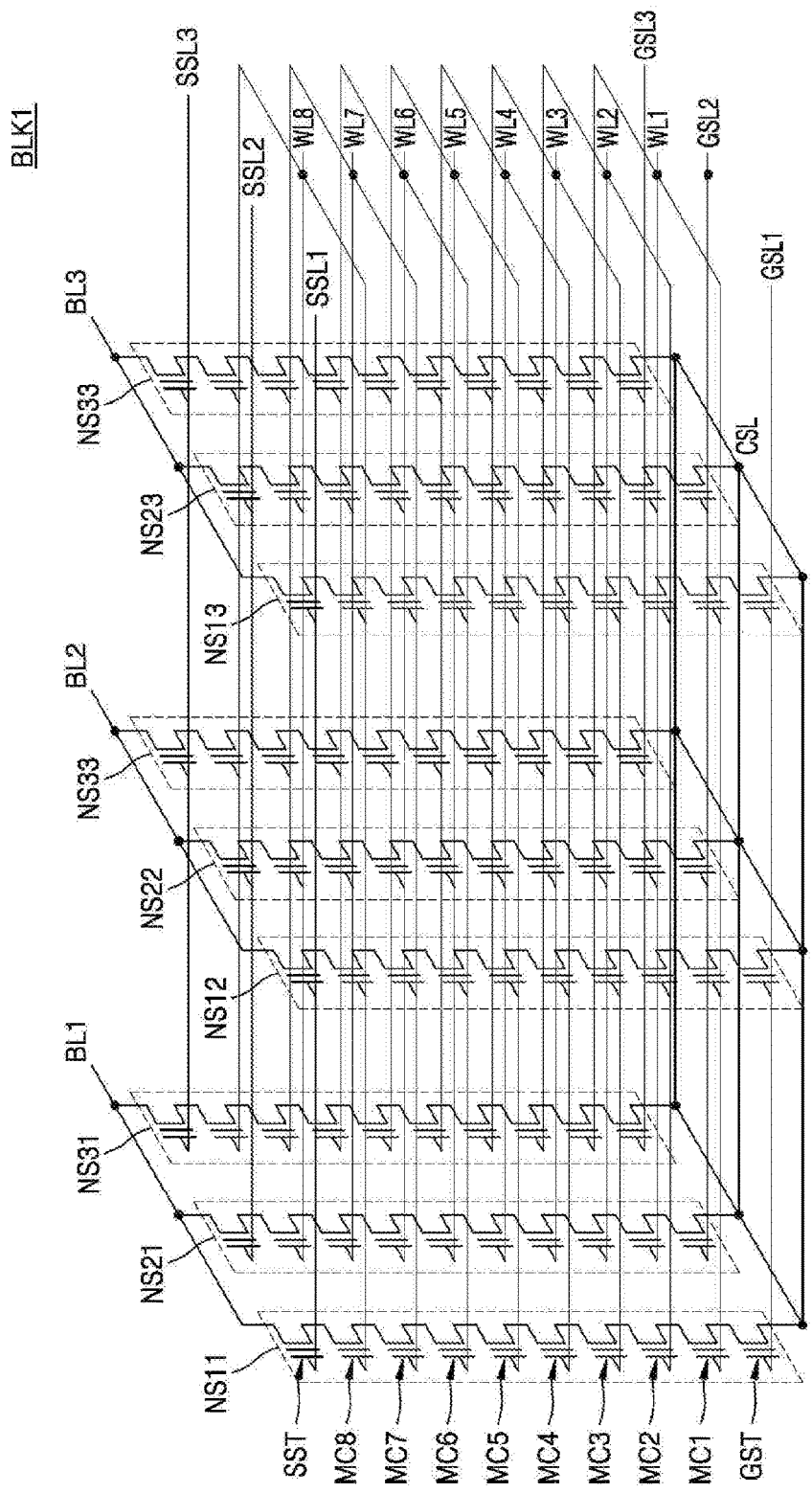
FIG. 6 illustrates an example of a memory array that may be included in the semiconductor chip according to an exemplary embodiment.

For example, each of the plurality of semiconductor chips 100 on one wafer WAF may be a NAND flash memory chip of a vertical structure including a plurality of blocks as shown in FIG. 6. Referring to FIG. 6, a first block BLK1 may include a plurality of NAND strings NS11, NS12, NS13, NS21, NS22, NS23, NS31, NS32, and NS33; a plurality of word line WL1, WL2, WL3, WL4, WL5, WL6, WL7, and WL8; a plurality of bit lines BL1, BL2, and BL3; a plurality of ground selection lines GSL1, GSL2, and GSL3; a plurality of string selection lines SSL1, SSL2, and SSL3; and a common source line CSL. In this regard, the number of the NAND strings NS11 through NS33, the word line WL1 through WL8, the bit lines BL1 through BL3, the ground selection lines GSL1 through GSL3, and the string selection lines SSL1 through SSL3 may vary according to embodiments.

The NAND strings NS11, N21, NS31 may be provided between the first bit lines BL1 and the common source line CSL. The NAND strings NS12, N22, NS32 may be provided between the second bit lines BL2 and the common source line CSL. The NAND strings NS13, N23, NS33 may be provided between the third bit lines BL3 and the common source line CSL. Each (for example, NS11) of the NAND strings NS11 through NS33 may include a string selection transistor SST, a plurality of memory cells MC1 through MC8, and a ground selection transistor GST that are serially connected to each other. For convenience of description, a NAND string may be referred to as a string below.

Strings that are commonly connected to one bit line may constitute one column. For example, the strings NS11, N21, NS31 that are commonly connected to the first bit line BL1 may correspond to a first column, the strings NS12, N22, NS32 that are commonly connected to the second bit line BL2 may correspond to a second column, and the NAND strings NS13, N23, NS33 that are commonly connected to the third bit line BL3 may correspond to a third column.

Strings that are connected to one string selection line may constitute one row. For example, the strings NS11, N12, NS13 that are connected to the first string selection line SSL1 may correspond to a first row, the strings NS21, N22, NS23 that are connected to the second string selection line SSL2 may correspond to a second row, and the NAND strings NS31, N32, NS33 that are connected to the third string selection line SSL3 may correspond to a third row.

The string selection transistor SST may be connected to the string selection lines SSL1 through SSL3. The plurality of memory cells MC1 through MC8 may be connected to the corresponding word lines WL1 through WL8. The ground selection transistor GST may be connected to the ground selection lines GSL1 through GSL3. The string selection transistor SST may be connected to the corresponding bit line BL. The ground selection transistor GST may be connected to the common source line CSL.

The word line (for example, WL1) of the same height may be commonly connected. The string selection lines SSL1 through SSL3 may be separated from each other. The ground selection lines GSL1 through GSL3 may be separated from each other. For example, when memory cells that are connected to the first word line WL1 and belong to the strings NS11, NS12, and NS13 are programmed, the first word line WL1 and the first string selection line SSL1 may be selected.

Returning to FIG. 5, the test system 500 may be a system on chip (SOC), an application processor (AP), etc. The plurality of semiconductor chips 100 may be manufactured on one wafer WAF through the same processing. However, various differences in the manufacturing processing, for example, a difference in a process, a temperature, and a voltage, may cause variations between the semiconductor chips 100. For example, if a temperature applied to a first semiconductor chip 100_1 is higher than a temperature applied to a second semiconductor chip 100_2 during an arbitrary processing stage, an inner resistance of a transistor formed in the first semiconductor chip 100_1 may be greater than an inner resistance of a transistor formed in the second semiconductor chip 100_2. Such a difference may result in a difference in the ISI characteristics between the semiconductor chips 100.

In a semiconductor chip and a method of testing the semiconductor chip according to an exemplary embodiment, the semiconductor chip 100 may include the pulse generator 120, the logic chain 140, and the detector 160 of FIG. 1 and detect a time when the test pulse TPLS is extinguished, and thus a degree of the ISI of each of the semiconductor chips 100 of a wafer level may be tested. The fast test pulse TPLS capable of determining the degree of the ISI in the semiconductor chip 100 may be generated to perform a test. The tester TST may generate the test result TRST based on the detection result DRST, thereby testing the degree of the ISI of the semiconductor chip 100 although the tester TST is a relatively low speed tester.

A process, voltage, and temperature (PVT) variation may be tested in the same way as described above. For example, it may be determined whether the PVT variation is within an allowable range based on the time when the test result TPLS is extinguished. As described above, the inner resistance of the transistor may increase in proportion to a temperature and also increase an influence of the ISI.

Figure 7:
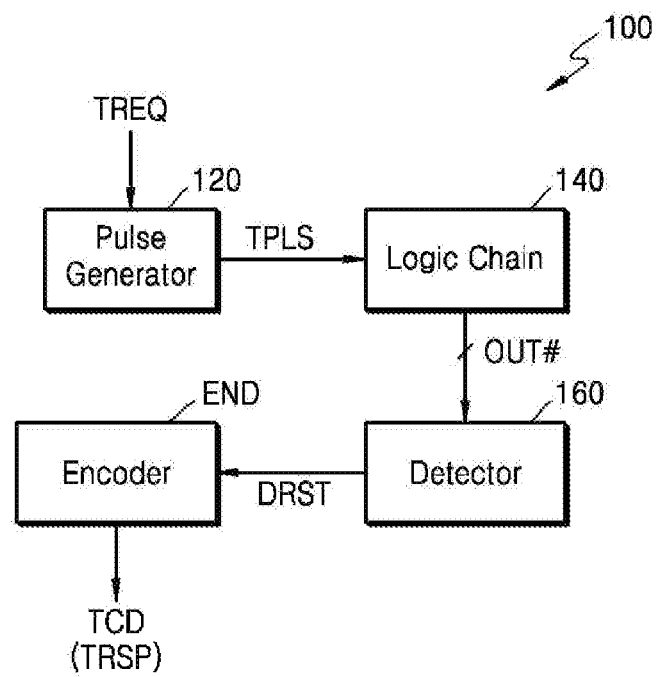
FIG. 7 illustrates a semiconductor chip according to exemplary embodiments.

The encoder END is included in the tester TST in FIG. 5 but is not limited thereto. As shown in FIG. 7, the encoder END may be included in the semiconductor chip 100. The encoder END may encode the detection result DRST received from the detector 160 in the test code TCD and transmit the test code TCD as the test response TRSP.

Figure 8:
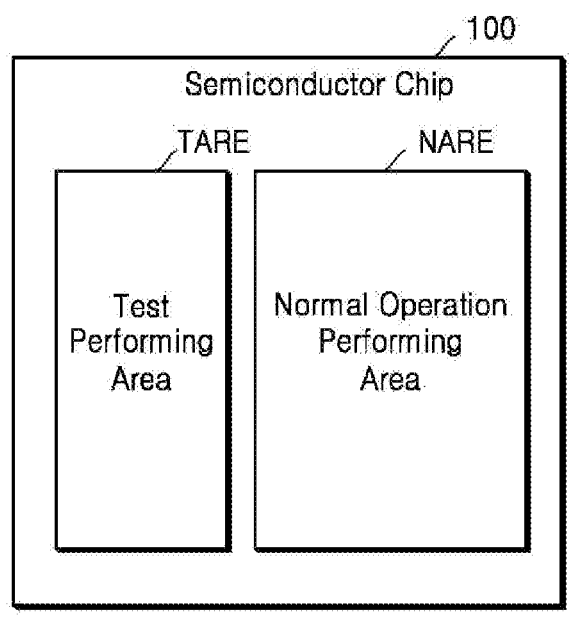
FIG. 8 illustrates a semiconductor chip according to exemplary embodiments.

FIG. 8 illustrates the semiconductor chip 100 according to an exemplary embodiment. Referring to FIG. 8, the semiconductor chip 100 may include a normal operation performing area NARE and a test performing area TARE. The normal operation performing area NARE may include logics for performing a normal operation required with respect to the semiconductor chip 100. For example, when the semiconductor chip 100 is a NAND flash memory chip of a vertical structure, the normal operation performing area NARE may include the logics that perform the normal operation such as program, read, and erase operations, on blocks and memory cells of FIG. 6. The test performing area TARE may include logic devices for performing a test on the semiconductor chip 100. For example, the test performing area TARE may include the pulse generator 120, the logic chain 140, and the detector 160 of FIG. 1 or the encoder END of FIG. 7.

Figure 9:
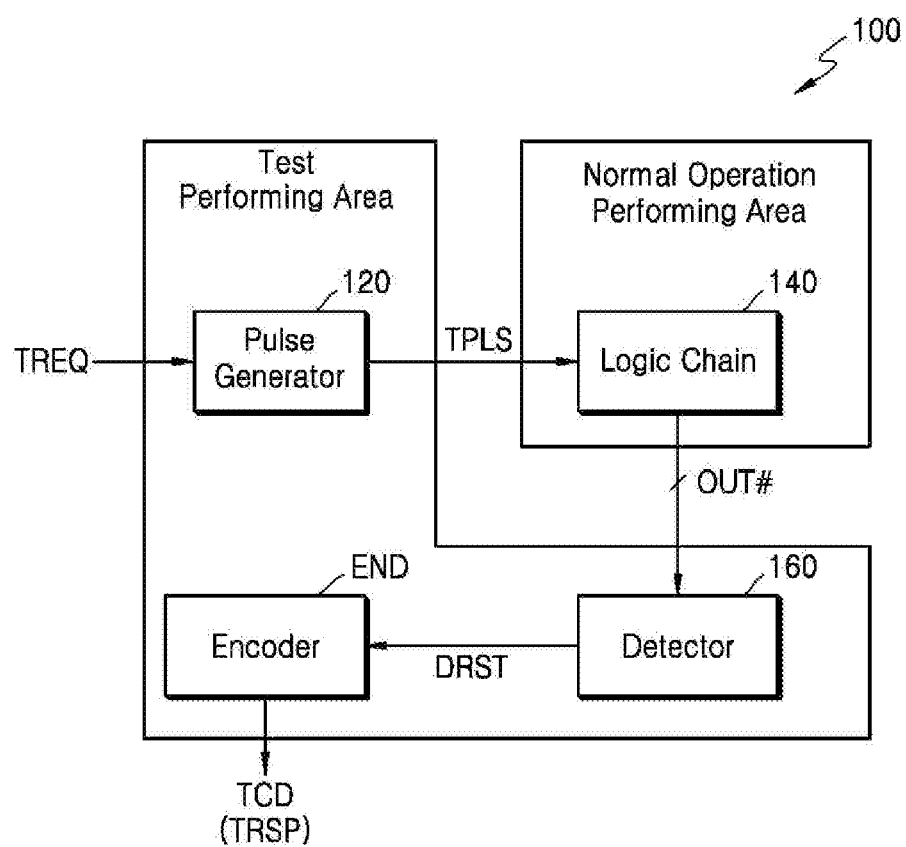
FIG. 9 illustrates a semiconductor chip according to exemplary embodiments.

However, the logic chain 140 may not be separately included in the test performing area TARE for the test and, as shown in FIG. 9, may be included in the normal operation performing area NARE and perform the normal operation in a normal mode. In a test mode, the logic chain 140 may receive the test pulse TPLS from the pulse generator 120 and perform the above-described test operation. The encoder END may be also included in the normal operation performing area NARE and encode an arbitrary signal in the normal mode. In the test mode, the encoder END may receive the detection result DRST from the detector 160 and generate the above-described test response TRSP. As described above, a semiconductor chip, a test system, and a method of testing the semiconductor chip according to an exemplary embodiment may use resources previously included in the semiconductor chip during a test operation, thereby increasing resource efficiency.

FIG. 10 is a flow chart of an example embodiment of a technique 1000 in accordance with the disclosed subject matter. In various embodiments, the technique 1000 may be used or produced by the systems such as those of the figures above. Although, it is understood that the above are merely a few illustrative examples to which the disclosed subject matter is not limited. It is understood that the disclosed subject matter is not limited to the ordering of or number of actions illustrated by technique 1000.

Block 1002 illustrates that, in one embodiment, a test request signal may be received by a semiconductor chip or device, as described above. In various embodiments, the test request signal may be received from a tester, as described above.

Block 1004 illustrates that, in one embodiment, a test pulse may be generated, as described above. In various embodiments, this may include selecting a particular pulse from a series of pulses created by an oscillator, as described above.

Block 1006 illustrates that, in one embodiment, the test pulse may be transmitted down or along a logic chain, as described above. As described above, the logic chain may include a plurality of logic devices arranged in series. As the test pulse travels down the logic chain, the test pulse may be attenuated, as described above.

Block 1008 illustrates that, in one embodiment, at each logic device (e.g. the output of the logic device), the strength or voltage of the test pulse may be measured or detected, as described above. In various embodiments, this may be done via a sub-detector circuit (e.g., a D flip-flop) that compares the received output of the logic device to a threshold value.

Block 1010 illustrates that, in one embodiment, the detected values may be converted into a detection result. In one embodiment, the detection result may include a plurality of bits, each bit corresponding to a sub-detector and to a logic device, as described above. This detection result may indicate at which logic device or a time point the test pulse attenuated below the threshold.

Block 1012 illustrates that, in one embodiment, the detection result may be output as a test response to the test request. In such an embodiment, this output may be presented or transmitted to the tester device, as described above.

While the disclosed subject matter has been particularly shown and described with reference to exemplary embodiments thereof, it will be understood that various changes in form and details may be made therein without departing from the spirit and scope of the following claims.

What is claimed is:

1. An apparatus comprising:
   a pulse generator configured to, in response to a test request, generate a test pulse to a logic chain;
   the logic chain comprising a plurality of logic devices, each logic device serially connected to each other and configured to transfer the test pulse sequentially through the logic chain; and
   a detector configured to detect, from at least a portion of the logic devices of the logic chain, a logic level of respective output signals from the respective logic devices, and output a detection result indicating a degree of an inter-symbol interference (ISI).

2. The apparatus of claim 1, wherein the pulse generator comprises:
   an oscillator which activates in response to the test request; and a selector configured to select one of multiple pulses that are output from the oscillator and output the selected pulse as the test pulse.

3. The apparatus of claim 1, wherein each of the plurality of logic devices comprises an even number of inverters.

4. The apparatus of claim 1, wherein the logic chain sequentially transfers the test pulse among the logic devices when the test request is activated and performs a normal operation of the apparatus when the test request is inactivated.

5. The apparatus of claim 1, wherein the detector comprises sub-detectors, and a number of sub-detectors is equal to a number of logic devices,
wherein each of the sub-detectors detects a level of an output of a corresponding logic device among the plurality of logic devices and outputs one of a logic high and a logic low.

6. The apparatus of claim 1, wherein the detector comprises sub-detectors, and a number of sub-detectors is equal to a number of logic devices,
wherein each of the sub-detectors comprises a D flip-flop, and for each of the sub-detectors, an initial value of the D flip-flop is maintained or inverted in response to an output of a logic device corresponding to the sub-detector from among the plurality of logic devices.

7. The apparatus of claim 1, further comprising: a three-dimensional memory array, wherein the three-dimensional memory array comprises the logic chain.

8. A system comprising:
a wafer comprising a plurality of semiconductor chips; and
a tester configured to, for each of the plurality of the semiconductor chips:
transfer a test request to the respective semiconductor chip,
receive a test response corresponding to the test request from the respective semiconductor chip, and
output a test result for the respective semiconductor chip,
wherein each of the plurality of semiconductor chips: generates a test pulse in response to the test request, and outputs a respective test response indicating an amount of inter-symbol interference (ISI) associated with the respective semiconductor chip.

9. The system of claim 8, wherein the tester comprises:
a test request generator configured to generate the test request;
an encoder configured to encode the test response received from the plurality of semiconductor chips in a test code indicating the time point when the test pulse is extinguished in each of the plurality of semiconductor chips; and
a comparator configured to compare the test code and a reference value, and output test results indicating whether any of the plurality of semiconductor chips are defective.

10. The system of claim 9, wherein the test results comprise information indicating whether any of the plurality of semiconductor chips fail to satisfy a required inter-symbol interference (ISI) characteristic.

11. The system of claim 9, wherein the test results comprise information indicating whether any of the plurality of semiconductor chips fail to satisfy at least one of a required process variation, voltage variation, and temperature variation.

12. The system of claim 8, wherein each of the plurality of semiconductor chips comprises:

a pulse generator configured to generate a test pulse in response to a test request;
a logic chain comprising a plurality of logic devices serially connected to each other and transferring the test pulse sequentially; and
a detector configured to detect a level of an output of each of the plurality of logics and output a detection result indicating a degree of an inter-symbol interference (ISI) characteristic.

13. The system of claim 12, wherein the detector comprises a same number of sub-detectors as a number of the plurality of logics,
wherein each of the sub-detectors detects a level of an output of a corresponding logic among the plurality of logics and outputs one of a logic high and a logic low.

14. The system of claim 12, wherein the detector comprises a same number of sub-detectors as a number of the plurality of logics,
wherein each of the sub-detectors comprises a D flip-flop that maintains or inverts an initial value according to whether the D flip-flop is clocked by an output of a corresponding logic among the plurality of logics.

15. The system of claim 12, wherein each of the plurality of semiconductor chips further comprises: an encoder configured to encode the detection result in a test code indicating the time point when the test pulse is extinguished and output test results as a test response.

16. A method comprising:
generating, by a semiconductor chip, a test pulse;
transmitting the test pulse down a logic chain of the semiconductor chip, wherein the logic chain comprises a plurality of logic devices arranged in series;
detecting, at each logic device of the logic chain, a strength of the test pulse; and
based upon a threshold value and the strength of the test pulse, generating a detection result that indicates an inter-symbol interference (ISI) characteristic of the semiconductor chip.

17. The method of claim 16, wherein the logic chain is configured to attenuate the test pulse as the test pulse is transmitted sequentially through the logic devices.

18. The method of claim 16, wherein the detection result comprises a plurality of bits, and each bit is associated with a logic device, such that the detection result comprises an indication of which logic device attenuated the test pulse below the threshold value.

19. The method of claim 16, wherein detecting comprises employing a plurality of sub-detector included by the semiconductor chip, wherein each sub-detector is associated with a logic device.

20. The method of claim 16, the semiconductor chip comprises a three-dimensional memory array that includes the logic chain.

21. An apparatus comprising:
a pulse generator configured to, in response to a test request, generate a test pulse to a logic chain;
the logic chain comprising a plurality of logic devices, each logic device serially connected to each other and configured to transfer the test pulse sequentially through the logic chain; and
a detector configured to detect whether the test pulse is attenuated below a threshold level.

22. The apparatus of claim 21, wherein the detector comprises a plurality of flip-flops, each flip-flop configured to receive a respective output signal from the respective logic device through clock terminal, and detect a logic level of the respective output signal, wherein the detect is configured to detect whether the test pulse is attenuated below a threshold level by measuring the logic level of at least one output signal.

* * * * *